United States Patent
Kajiwara et al.

(10) Patent No.: US 6,833,626 B2
(45) Date of Patent: Dec. 21, 2004

(54) MULTICHIP MODULE STRUCTURE

(75) Inventors: Jun Kajiwara, Kyoto (JP); Masayoshi Kinoshita, Osaka (JP); Shiro Sakiyama, Osaka (JP)

(73) Assignee: Matsushita Electric Industrial. Co., Ltd., Osaka (JP)

( * ) Notice: Subject to any disclaimer, the term of this patent is extended or adjusted under 35 U.S.C. 154(b) by 129 days.

(21) Appl. No.: 10/189,549

(22) Filed: Jul. 8, 2002

(65) Prior Publication Data

US 2003/0008424 A1 Jan. 9, 2003

(30) Foreign Application Priority Data

Jul. 9, 2001 (JP) .................................... 2001-207349

(51) Int. Cl.[7] ............................................. H01L 29/40
(52) U.S. Cl. ..................................................... 257/777
(58) Field of Search ................................ 257/777–780, 257/685–688, 724, 723, 738

(56) References Cited

U.S. PATENT DOCUMENTS

| | | |
|---|---|---|
| 5,149,662 A | 9/1992 | Eichelberger |
| 5,198,963 A | 3/1993 | Gupta et al. |
| 5,504,354 A | 4/1996 | Mohsen |
| 5,703,747 A | 12/1997 | Voldman et al. |
| 5,808,877 A | 9/1998 | Jeong et al. |
| 5,918,107 A | 6/1999 | Fogal et al. |
| 5,973,340 A | 10/1999 | Mohsen |

FOREIGN PATENT DOCUMENTS

| | | | | |
|---|---|---|---|---|
| JP | 58-92230 | 6/1983 | | |
| JP | 2000-258494 | 9/2000 | | |
| JP | 2000258494 | * 9/2000 | ........... H01L/23/52 |

* cited by examiner

*Primary Examiner*—Craig A. Thompson
(74) *Attorney, Agent, or Firm*—McDermott Will & Emery LLP

(57) ABSTRACT

A large chip includes a first set of branch wires that branch off from a first trunk wire and extend to respective wires so as to be connected to respective bond pads. Each of the branch wires of the first set includes a connection control element and a resistor. A small chip includes a second set of branch wires that branch off from a second trunk wire and extend to respective wires so as to be connected to respective bond pads. Each of the branch wires of the second set includes a connection control element and a resistor. Whether connection is properly made or not between the bond pads is determined by measuring a current value when voltage is applied to first and second test pads.

10 Claims, 12 Drawing Sheets

MULTICHIP MODULE STRUCTURE

BACKGROUND OF THE INVENTION

The present invention relates to a chip-on-chip multichip module in which a plurality of chips are bonded to each other and a method for performing a connection test for the module.

Recently, a "single-chip system LSI", that is, an LSI with a multiplicity of functions integrated together within a single chip, has been introduced and various design techniques have been proposed for the single-chip system LSI. In particular, an advantage of the single-chip system LSI is that a high-performance multifunction device is realized with a multiplicity of functions such as memories of, e.g., a dynamic random access memory (DRAM) and a static dynamic random access memory (SRAM) and circuits of, e.g., logic and analog circuits, integrated within a single semiconductor chip. However, in fabricating multiple devices on a single substrate, which require different manufacturing processes, many problems regarding costs and manufacturing techniques have to be overcome.

In order to solve these problems, a chip-on-chip system LSI formed by bonding multiple chips to each other was proposed as disclosed in Japanese Laid-Open Publication No. 58-922330. A chip-on-chip multichip module is formed as follows. Pad electrodes formed on the upper surface of a chip (i.e., a mother chip) functioning as a substrate, are connected, via bumps, to corresponding pad electrodes formed on the upper surfaces of chips-to-be-mounted (i.e., daughter chips), and the mother chip and the daughter chips are then bonded to each other. In this manner, the mother and daughter chips are electrically connected to each other, thereby forming the multichip module. Unlike the single-chip system LSI, multiple functions are separately integrated into the respective multiple chips in the chip-on-chip multichip module. Thus, the chips can have their size reduced and their yield increased. In addition, since the chip-on-chip multichip module can easily include devices that are different in type and process generation, the resultant device is easily implemented as a multifunction device. Furthermore, wiring length required for communication between the mother and daughter chips is very short in a system LSI utilizing the chip-on-chip multichip module, as compared to system LSIs utilizing other types of multichip modules. This allows high-speed communication, which is as fast as communication between blocks in the known single-chip system LSI.

As described above, the chip-on-chip multichip module is a very important technique replacing the known single-chip system LSI. However, an appropriate means for testing connections between the pads when the chips are bonded to each other has not yet been established.

Specifically, each of the mother and daughter chips includes a number of the pads used for sending and receiving signals and the mother chip pads and daughter chip pads are bonded to each other. Thus, required is a means with a simple structure for quick testing a very large number of the connections between the pads.

SUMMARY OF THE INVENTION

In view of the fact that an impedance value can be measured at a very high sensitivity in a structure where impedance elements are placed in parallel, the present invention is made for providing a chip-on-chip multichip module having a structure that allows a large number of connections between bond pads in the module to be tested in a quick and simple manner, and a method for performing such connection test for the module.

An inventive multichip module, which includes a plurality of chips each having a plurality of bond pads, and which is formed by electrically connecting the bond pads of one of the chips to the corresponding bond pads of another one of the chips, includes: a plurality of trunk wires; and a plurality of branch wires, which are connected to two of the trunk wires so as to be in parallel with each other. Each of the bond pads is connected to an associated one of the trunk wires via an associated one of the branch wires.

In the inventive module, where connections are made between the parallel-connected bond pads that are connected to one of the trunk wires and the corresponding parallel-connected bond pads connected to another one of the trunk wires, if any one of such electrical connections is poorly made, a current value flowing between the trunk wires is smaller than a current value supposed to be obtained where there is no poor connection. Thus, attainable is a multichip module with a structure that makes it possible to perform, in a simple and quick manner, a test for determining whether the connection between the bond pads is properly made or not when the chips are bonded to each other.

In one embodiment of the present invention, the inventive module may further include a plurality of connection control elements inserted in the respective branch wires.

In this particular embodiment, each of the connection control elements is a switching element or a rectifying element having a polarity by which the rectifying element is forward biased when a voltage is applied to the branch wires at a time of a connection test.

In one embodiment of the present invention, the chips include a first chip having a first set of bond pads, and a second chip having a second set of bond pads. The first and second sets of bond pads are electrically connected to each other. The trunk wires include a first trunk wire and a second trunk wire. The branch wires include a first set of branch wires branching off from the first trunk wire, and a second set of branch wires branching off from the second trunk wire. The bond pads of the first set are connected to the branch wires of the first set, respectively. The bond pads of the second set are connected to the branch wires of the second set, respectively. Then, it is possible to obtain a multichip module with a structure that allows connection between the two chips having their respective internal circuits to be easily tested.

In this particular embodiment, one set of the first and second sets of branch wires may extend into the first and second chips.

In another embodiment, the chips include: a first chip having a first set of bond pads; a second chip having a second set of bond pads; a third chip having a third set of bond pads, a fourth set of bond pads, and wires connecting the third and fourth sets of bond pads to each other. The bond pads of the first set are electrically connected to the respective bond pads of the third set, and the bond pads of the second set are electrically connected to the respective bond pads of the fourth set. The trunk wires include a first trunk wire and a second trunk wire. And the branch wires include: a first set of branch wires branching off from the first trunk wire and located between the first trunk wire and the bond pads of the first set, and a second set of branch wires branching off from the second trunk wire and located between the second trunk wire and the bond pads of the second set. In that case, it is possible to obtain a multichip module suitable for a case in which the third chip is used as a chip including only wires.

In another embodiment of the present invention, the chips include a first chip having a first set of bond pads, and a second chip having a second set of bond pads. The first and second sets of bond pads are electrically connected to each other. The trunk wires include a first trunk wire, a second trunk wire, and an intermediate trunk wire that is connected to the first and second trunk wires. The branch wires include: a first set of branch wires that extend from the first trunk wire so as to be in parallel with each other; a second set of branch wires that extend from the second trunk wire so as to be in parallel with each other; a first set of intermediate branch wires that extend from the intermediate trunk wire so as to be in parallel with each other and in series with the respective branch wires of the first set; and a second set of intermediate branch wires that extend from the intermediate trunk wire so as to be in parallel with each other and in series with the respective branch wires of the second set. The bond pads of the first set are connected to the branch wires of the first or second set, respectively. And the bond pads of the second set are connected to the intermediate branch wires of the first or second set, respectively. Then, it is possible to obtain a structure allowing a connection test to be performed using only the bond pads for practical use.

In another embodiment, the chips include a first chip having a first set of bond pads, a second chip having a second set of bond pads, and a third chip having a third set of bond pads. The first chip and the second chip are electrically connected to each other, and the first chip and the third chip are electrically connected to each other. The trunk wires include a first trunk wire, a second trunk wire, and an intermediate trunk wire that is connected to the first and second trunk wires and that extends into the second and third chips. The branch wires include: a first set of branch wires that extend from the first trunk wire so as to be in parallel with each other; a second set of branch wires that extend from the second trunk wire so as to be in parallel with each other; a first set of intermediate branch wires that extend from the intermediate trunk wire so as to be in parallel with each other and in series with the respective branch wires of the first set; and a second set of intermediate branch wires that extend from the intermediate trunk wire so as to be in parallel with each other and in series with the respective branch wires of the second set. The bond pads of the first set are connected to the branch wires of the first or second set, respectively. The bond pads of the second set are connected to the intermediate branch wires of the first set, respectively. And the bond pads of the third set are connected to the intermediate branch wires of the second set, respectively. Then, it is possible to obtain a structure allowing connection made among the three chips to be tested in a simple and quick manner.

In another embodiment, a resistor is inserted in at least one of two parts of each said branch wire. Each of the two parts is interposed between one of the two trunk wires and a pair of mutually connected bond pads. Then, connection between the bond pads can be measured at a higher sensitivity by adjusting resistance value of the resistor as necessary.

In another embodiment, each of the connection control elements may be a switching element, or each of the connection control elements may be a rectifying element having a polarity by which the rectifying element is forward biased when a voltage is applied to the branch wires at a time of a connection test.

An inventive method is a method for performing a connection test for a multichip module that includes a plurality of chips each having a plurality of bond pads for practical use, and that is formed by electrically connecting the bond pads of one of the chips to the corresponding bond pads of another one of the chips. The method includes the step of: a) forming a test circuit, which includes: a plurality of branch wires, which are connected to two of trunk wires so are to be in parallel with each other; and connection control elements inserted in the branch wires, respectively. In the method, each of the bond pads is connected to an associated one of the branch wires. The method further includes the step b) forming the test circuit so that no electricity is allowed to flow between the bond pads that are connected to an associated one of the trunk wires during an actual operation of the multichip module, and that electricity is allowed to flow between the trunk wires via the connection control elements during a connection test. And the method further includes the step of c) measuring impedance of paths between the trunk wires, thereby determining whether connection is properly made or not between the bond pads of the chips.

According the inventive method, it is possible to determine whether connection of a multichip module is properly made or not, in a quick and simple manner.

In one embodiment of the present invention, the connection control elements are switching elements, and the switching elements are controlled in such a manner that the switching elements are opened during an actual operation of the multichip module so as to allow no electricity to flow between the bond pads that are connected to the associated one of the trunk wires, and that the switching elements are closed during a connection test so as to allow electricity to flow between the trunk wires. Then, it is possible to determine whether connection of a multichip module is properly made or not, in a quick and simple manner.

In another embodiment of the present invention, the connection control elements in the respective branch wires that are connected to an associated one of the trunk wires are rectifying elements having the same polarity for a current flowing to/from the associated one of the trunk wires. During an actual operation of the multichip module, two of the rectifying elements exist in a path between any two of the bond pads connected to the associated one of the trunk wires and have mutually opposite polarities for a current flowing in the path, thereby allowing no electricity to flow between the bond pads. During a connection test, the rectifying elements in the respective branch wires are forward biased, thereby allowing electricity to flow between the trunk wires. Then, it is possible to determine whether connection of a multichip module is properly made or not, in a quick and simple manner.

DESCRIPTION OF THE PREFERRED EMBODIMENTS

Embodiment 1

Figure 1:
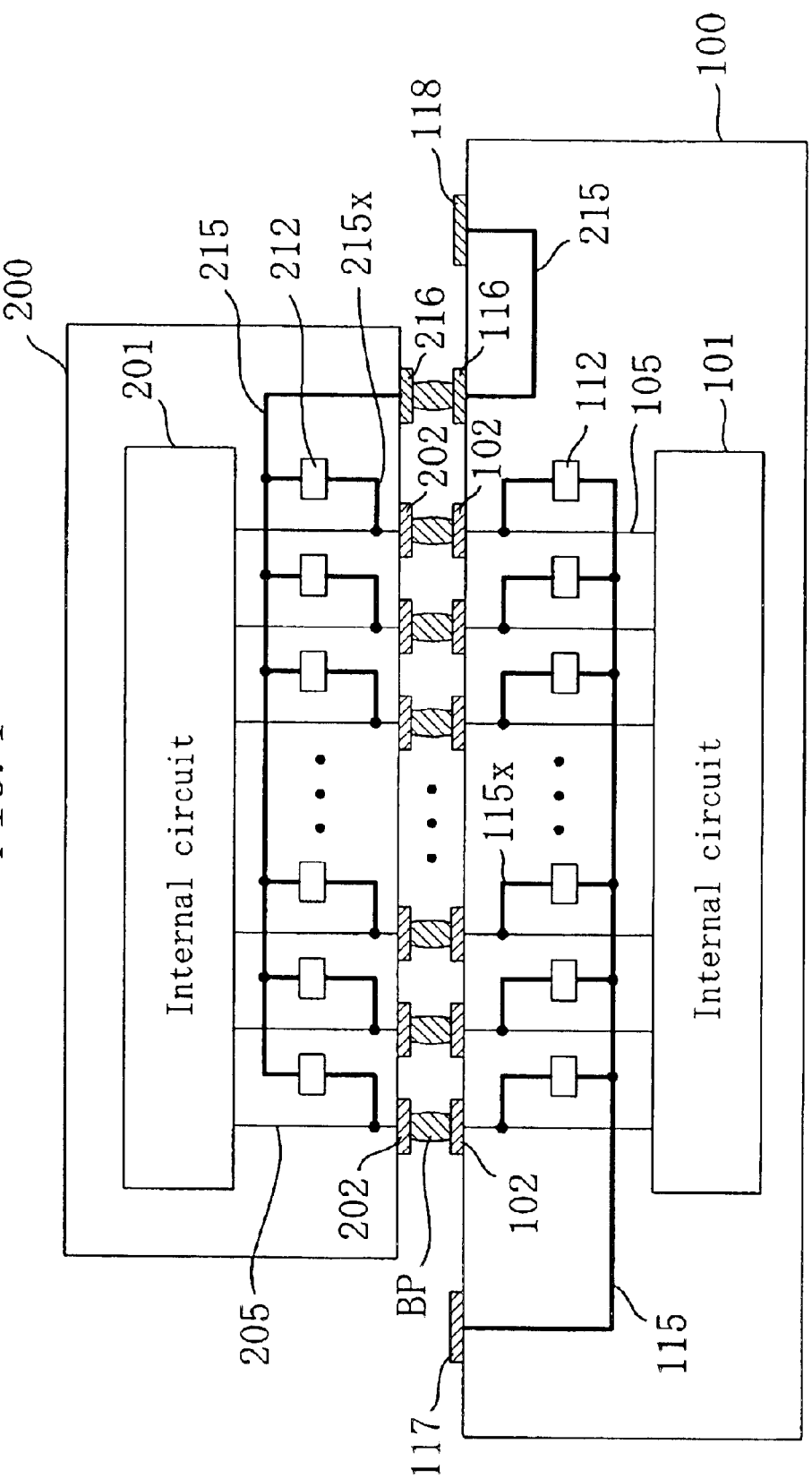
FIG. 1 is a cross-sectional view illustrating an interconnect structure and a circuit configuration in a multichip module according to a first embodiment of the present invention.

FIG. 1 is a cross-sectional view illustrating an interconnect structure and a circuit configuration in a multichip module according to a first embodiment of the present invention. In this embodiment, an exemplary module, in which a large chip 100 and a small chip 200 include their associated internal circuit, will be described.

As shown in FIG. 1, the large chip 100 includes a number of bond pads 102 and the small chip 200 includes a number of bond pads 202. The bond pads 102 are connected to an internal circuit 101 in the large chip 100 via wires 105. The bond pads 202 are connected to an internal circuit 201 in the small chip 200 via wires 205. The bond pads 102 of the large chip 100 and the bond pads 202 of the small chip 200 are connected to each other via bumps BP.

Further, a circuit for a connection test in the large chip 100 includes a first test pad 117 and a second test pad 118. A first test voltage is applied to the first test pad 117 and a second test voltage is applied to the second test pad 118. One of the first and second test voltages is higher than the other. Also provided in the circuit are a first trunk wire 115, which extends from the first test pad 117, and first branch wires 115x, which branch off from the first trunk wire 115 and extend to be connected to the corresponding wires 105. In other words, the first branch wires 115x are connected to the corresponding bond pads 102 via the wires 105. Each of the first branch wires 115x includes a connection control element 112. The connection-test circuit in the large chip 100 also includes a second trunk wire 215, which extends from the second test pad 118 into the small chip 200 via a pad 116.

A circuit for a connection test in the small chip 200 includes a pad 216, the second trunk wire 215 and second branch wires 215x. The pad 216 is connected to the pad 116 of the large chip 100 via the bump BP. The second trunk wire 215 extends from the pad 216. The second branch wires 215x branch off from the second trunk wire 215 and each second branch wire 215x extends to its corresponding wire 205. That is, the second branch wires 215x are connected to the respective bond pads 202 via the wires 205. Each second branch wire 215x includes a connection control element 212. The pad 216 is connected to the pad 116 of the large chip 100 via the bump BP.

The small chip 200 is mounted onto the large chip 100 and the bumps BP are interposed between the bond pads 102 of the large chip 100 and the bond pads 202 of the small chip 200, and between the pad 116 of the large chip 100 and the pad 216 of the small chip 200. With the bond pads 102 and the pad 116 electrically connected to the bond pads 202 and the pad 216, respectively, via the bumps BP, the large and small chips 100 and 200 are bonded to each other.

Specifically, a circuit for a connection test is configured, starting from the first test pad 117 of the large chip 100 to the second test pad 118 of the large chip 100 via the first trunk wire 115, first branch wires 115x, bond pads 102, bond pads 202, second branch wires 215x, second trunk wire 215, pad 216, and pad 116 in this order. This means that the two pads 216 and 117 are inserted in the second trunk wire 215.

As described above, the bond pads are bonded and electrically connected to each other via the bumps. The bond pads are electrically connected to the wires via respective plugs. Thus, the wires (or the internal circuit) of the large chip 100 are connected to the internal circuit of the small chip 200.

In the multichip module of this embodiment, a connection test to determine whether the bond pads are properly connected to each other when the small chip 200 is bonded onto the large chip 100 can be performed as follows.

First, test pins of a tester are put into contact with the first and second test pads 117 and 118, respectively. Then, a first voltage (of e.g., about 2 V) and a second voltage (of e.g., 0 V) are respectively applied to the first and second test pads 117 and 118 from the respective test pins. An electric current flowing between the first and second test pads 117 and 118 is then measured. If the measured current value is smaller, by a predetermined value, than a current value that is supposed to be obtained when all the pads are properly connected to each other, it is determined that part of the connections is not properly made between the bond pads. Thus, it is possible to test the connection of the multichip module, in which the multiple chips are bonded to each other, in a simple and quick manner.

An element having impedance to current flow and having a current control function, i.e., current is allowed to flow into the branch wires during a test and no current is allowed to flow into the branch wires during an actual operation of the module, may be adopted as the connection control element in this embodiment. An example of such elements is an MIS transistor.

Embodiment 2

Figure 2:
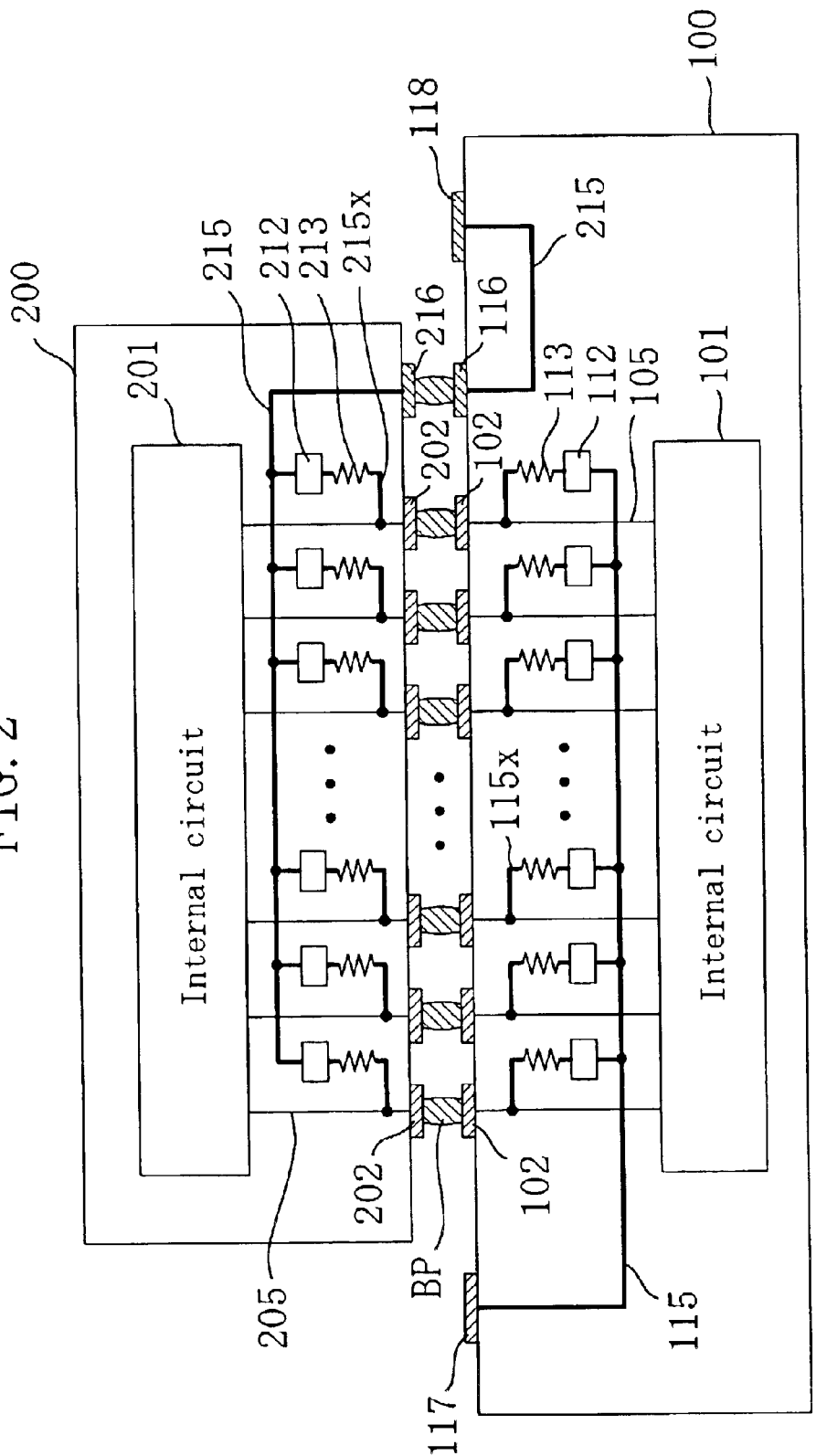
FIG. 2 is a cross-sectional view illustrating an interconnect structure and a circuit configuration in a multichip module according to a second embodiment of the present invention.

FIG. 2 is a cross-sectional view illustrating an interconnect structure and a circuit configuration in a multichip module according to a second embodiment of the present invention. In this embodiment, an exemplary module, in which a large chip 100 and a small chip 200 include their associated internal circuit, will be described.

As shown in FIG. 2, the large chip 100 includes a number of bond pads 102 and the small chip 200 includes a number of bond pads 202. The bond pads 102 are connected to an internal circuit 101 in the large chip 100 via wires 105. The bond pads 202 are connected to an internal circuit 201 in the small chip 200 via wires 205. The bond pads 102 of the large chip 100 and the bond pads 202 of the small chip 200 are connected to each other via bumps BP.

Further, a circuit for a connection test in the large chip 100 includes a first test pad 117 and a second test pad 118. A first test voltage is applied to the first test pad 117 and a second test voltage is applied to the second test pad 118. One of the first and second test voltages is higher than the other. Also provided in the circuit are a first trunk wire 115, which extends from the first test pad 117, and first branch wires 115x, which branch off from the first trunk wire 115 and extend to be connected to the corresponding wires 105. In other words, the first branch wires 115x are connected to the corresponding bond pads 102 via the wires 105. Each of the first branch wires 115x includes a connection control element 112 and a resistor 113 in series. The connection-test circuit in the large chip 100 also includes a second trunk wire 215, which extends from the second test pad 118 to a pad 116.

A circuit for a connection test in the small chip 200 includes a pad 216, the second trunk wire 215 and second branch wires 215x. The pad 216 is connected to the pad 116 of the large chip 100 via the bump BP. The second trunk wire 215 extends from the pad 216. The second branch wires 215x branch off from the second trunk wire 215 and each second branch wire 215x extends to its corresponding wire 205. That is, the second branch wires 215x are connected to the respective bond pads 202 via the wires 205. Each second branch wire 215x includes a connection control element 212 and a resistor 213 in series. The pad 216 is connected to the pad 116 of the large chip 100 via the bump BP.

The small chip 200 is mounted onto the large chip 100 and the bumps BP are interposed between the bond pads 102 of the large chip 100 and the bond pads 202 of the small chip 200, and between the pad 116 of the large chip 100 and the pad 216 of the small chip 200. With the bond pads 102 and the pad 116 electrically connected to the bond pads 202 and the pad 216, respectively, via the bumps BP, the large and small chips 100 and 200 are bonded to each other.

A circuit for a connection test is configured, also in this embodiment, starting from the first test pad 117 of the large chip 100 to the second test pad 118 of the large chip 100 via the first trunk wire 115, first branch wires 115x, bond pads 102, bond pads 202, second branch wires 215x, second trunk wire 215, pad 216, and pad 116 in this order. This means that the two pads 216 and 116 are inserted in the second trunk wire 215.

As described above, the bond pads are bonded and electrically connected to each other via the bumps. The bond pads are electrically connected to the wires via respective plugs. Thus, the wires (or the internal circuit) of the large chip 100 are connected to the internal circuit of the small chip 200.

As the connection control element in this embodiment, an element having a current control function, which allows current to flow into the branch wires during a test and no current to flow into the branch wires during an actual operation of the module, may be adopted. Hereinafter, an exemplary structure of the connection control element will be described.

FIRST EXAMPLE OF SECOND EMBODIMENT

Figure 3:
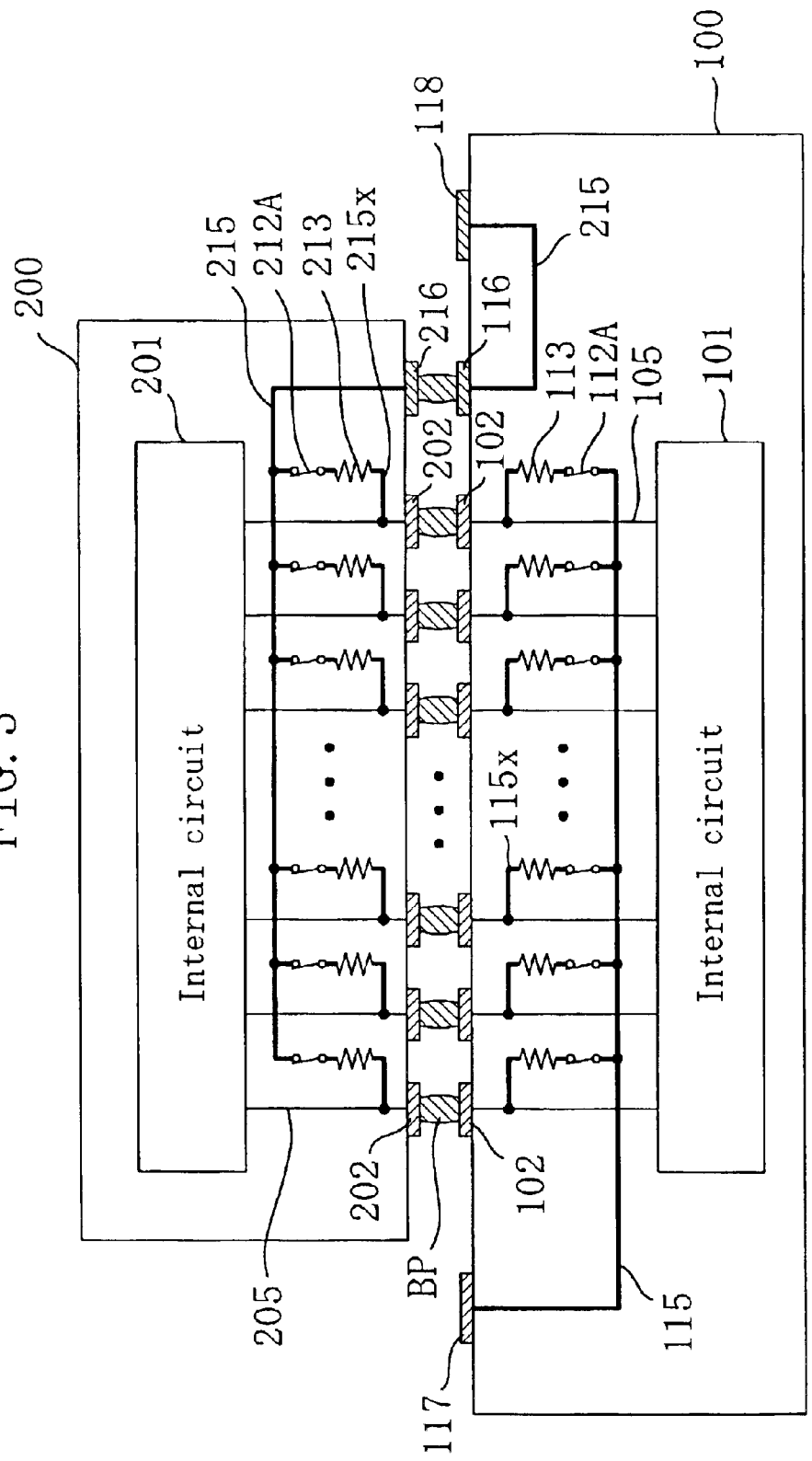
FIG. 3 is a cross-sectional view illustrating an interconnect structure and a circuit configuration in a multichip module according to a first example of the second embodiment of the present invention

FIG. 3 is a cross-sectional view illustrating an interconnect structure and a circuit configuration in a multichip module according to a first example of the second embodiment of the present invention.

This exemplary module has a structure that is almost the same as the structure shown in FIG. 2, except that switching transistors 112A and 212A are included as the connection control elements. A control circuit (not shown) turns the switching transistors 112A and 212A ON to allow the flow of current during a connection test, while the control circuit turns the switching transistors 112A and 212A OFF to block the flow of current during an actual operation of the module.

SECOND EXAMPLE OF SECOND EMBODIMENT

Figure 4:
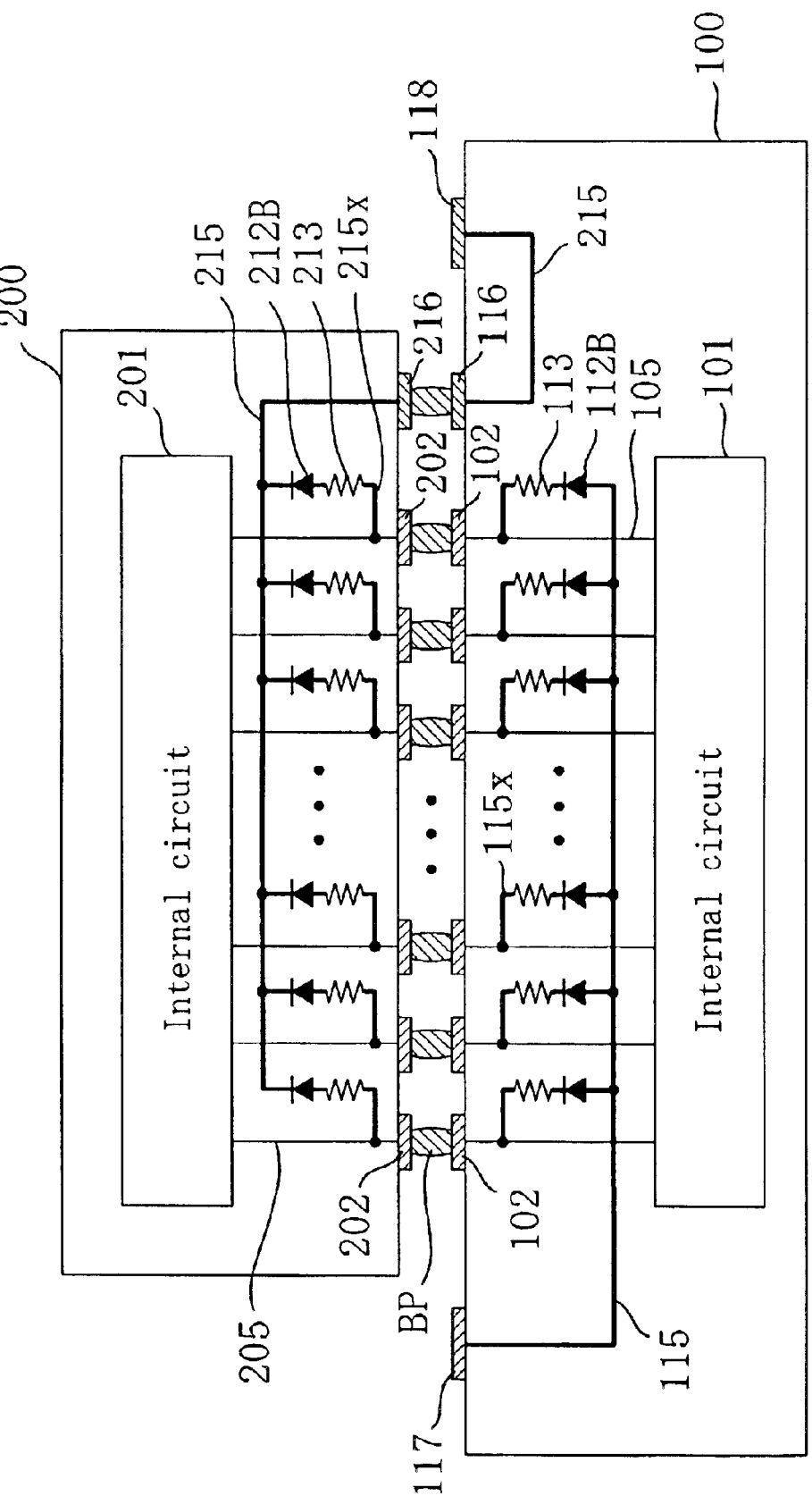
FIG. 4 is a cross-sectional view illustrating an interconnect structure and a circuit configuration in a multichip module according to a second example of the second embodiment of the present invention.

FIG. 4 is a cross-sectional view illustrating an interconnect structure and a circuit configuration in a multichip module according to a second example of the second embodiment of the present invention.

This exemplary module has a structure that is almost the same as the structure shown in FIG. 2, except that diodes 112B and 212B are included as the connection control elements. The diodes 112B and 212B have a polarity by which the diodes are forward biased when test voltages are applied at the time of a connection test.

In the module with this structure, current is allowed to flow during the connection test, while current is blocked so as not to flow between the wires (i.e., the bond pads) connected to an associated one of the trunk wires during an actual operation of the module because a pair of the diodes existing in each path between any two of the wires (i.e., the bond pads) connected to the associated one of the trunk wires have mutually-opposite polarities (PN directions) for a current flowing in the path. The operation of the connection control elements does not have to be controlled. However, it should be noted that a high potential voltage has to be applied to the first test pad 117 and a low potential voltage has to be applied to the second test pad 118 at the time of the connection test.

After the connection test has been completed, in order to use the multichip module as a commercial product, the first and second test pads 117 and 118 are connected to a ground wire and a power voltage supply wire of an I/O circuit, respectively, so that no current flows into the connection test circuit.

Embodiment 3

Figure 5:
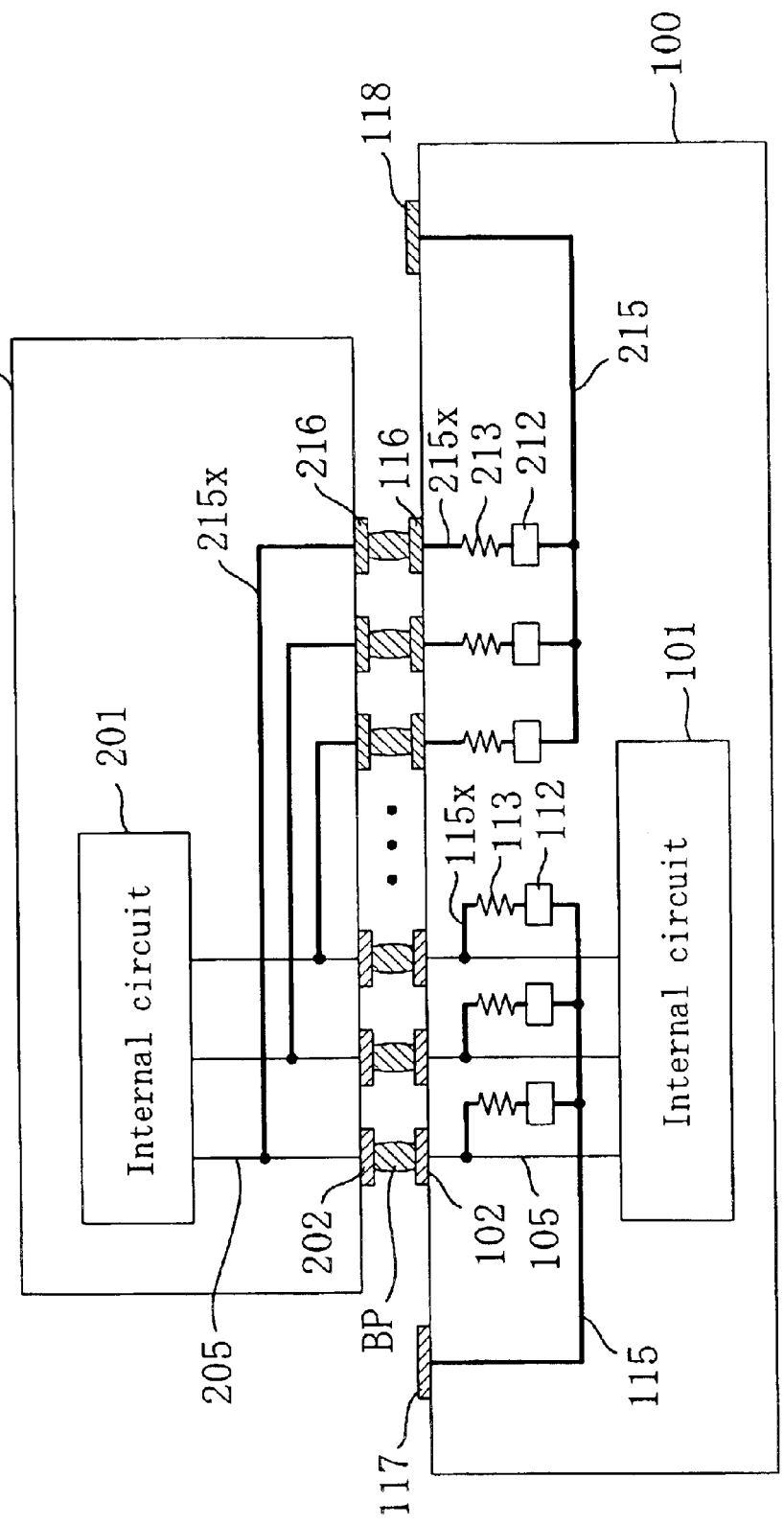
FIG. 5 is a cross-sectional view illustrating an interconnect structure and a circuit configuration in a multichip module according to a third embodiment of the present invention.

FIG. 5 is a cross-sectional view illustrating an interconnect structure and a circuit configuration in a multichip module according to a third embodiment of the present invention. In this embodiment, an exemplary module, in which a large chip 100 and a small chip 200 include their associated internal circuit, will be described.

As shown in FIG. 5, the large chip 100 includes a number of bond pads 102 and the small chip 200 includes a number of bond pads 202. The bond pads 102 are connected to an internal circuit 101 in the large chip 100 via wires 105. The bond pads 202 are connected to an internal circuit 201 in the small chip 200 via wires 205. The bond pads 102 of the large chip 100 and the bond pads 202 of the small chip 200 are connected to each other via bumps BP.

Further, a circuit for a connection test in the large chip 100 includes a first test pad 117 and a second test pad 118. A first test voltage is applied to the first test pad 117 and a second test voltage is applied to the second test pad 118. One of the first and second test voltages is higher than the other. Also provided in the circuit are a first trunk wire 115, first branch wires 115x, a second trunk wire 215, and second branch wires 215x. The first trunk wire 115 extends from the first test pad 117. The first branch wires 115x branch off from the first trunk wire 115 and extend to be connected to the corresponding wires 105. The second trunk wire 215 extends from the second test pad 118. The second branch wires 215x branch off from the second trunk wire 215 and extend to be connected to corresponding pads 116. In other words, the first branch wires 115x are connected to the corresponding bond pads 102 via the wires 105. Each of the first branch wires 115x includes a connection control element 112 and a resistor 113 in series. Each of the second branch wires 215x also includes a connection control element 212 and a resistor 213 in series.

A circuit for a connection test in the small chip 200 includes pads 216 and the second branch wires 215x. The pads 216 are connected to the pads 116 of the large chip 100 via the bumps BP. The second branch wires 215x branch off from the second trunk wire 215 and each second branch wire 215x extends to its corresponding wire 205. That is, the second branch wires 215x are connected to the bond pads 202 via the wires 205. The second branch wires 215x of the small chip 200 include neither a connection control element nor a resistor. The pads 216 are connected to the pads 116 of the large chip 100 via the bumps BP. The small chip 200 is mounted onto the large chip 100 and the bumps BP are interposed between the bond pads 102 of the large chip 100 and the bond pads 202 of the small chip 200, and between the pads 116 of the large chip 100 and the pads 216 of the small chip 200. With the bond pads 102 and the pads 116 electrically connected to the bond pads 202 and the pads 216, respectively, via the bumps BP, the large and small chips 100 and 200 are bonded to each other.

In this embodiment, a circuit for a connection test is also configured, starting from the first test pad 117 of the large chip 100 to the second test pad 118 of the large chip 100 via the first trunk wire 115, first branch wires 115x, bond pads 102, bond pads 202, second branch wires 215x, pads 216, pads 116 and second trunk wire 215 in this order. This means that the pads 216 and 116 are inserted in the second trunk wire 215.

As described above, in the multichip module in which the multiple chips are bonded to each other, the elements of the connection test circuit can be arranged only in one of the chips and only the branch wires of the connection test circuit can be included in the other chip.

Embodiment 4

Figure 6:
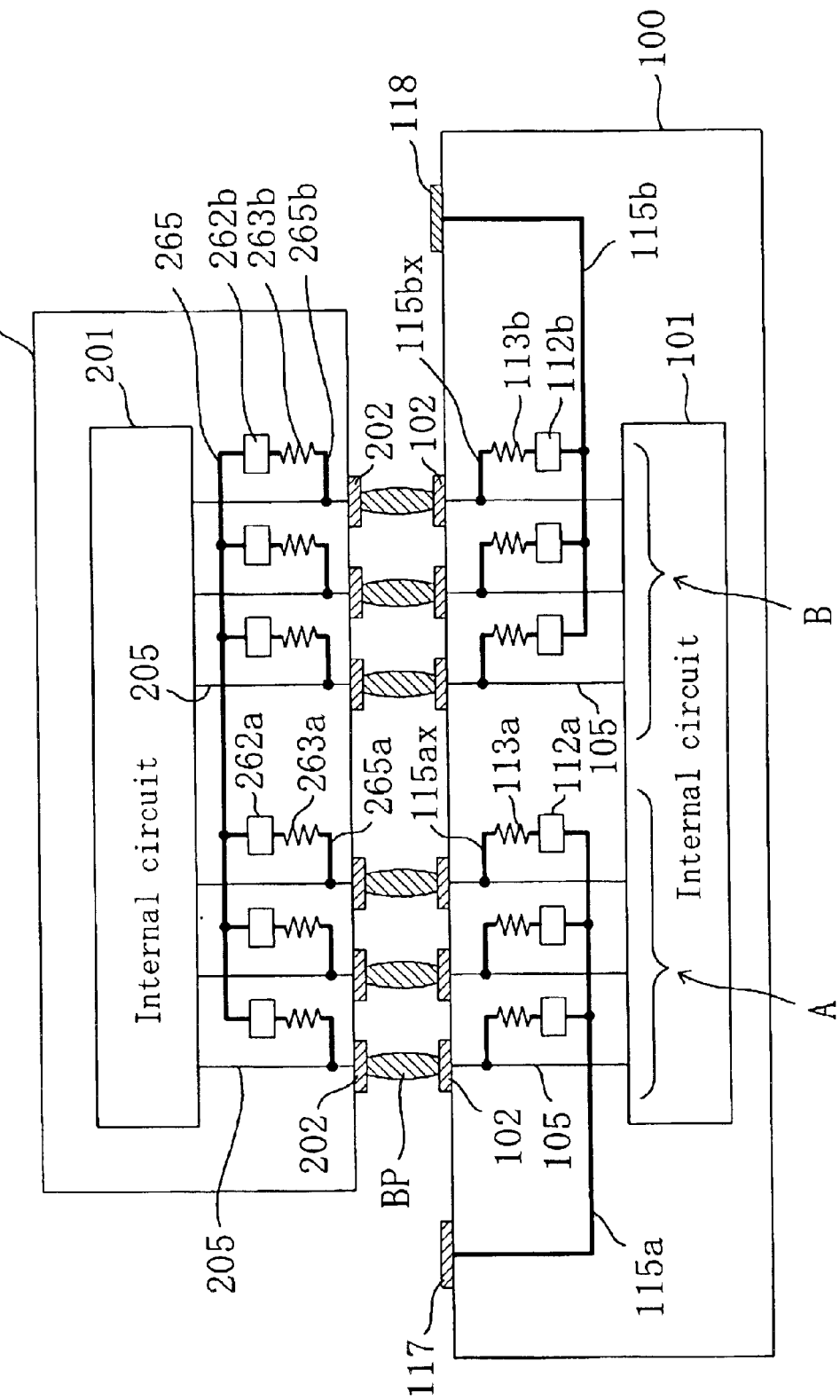
FIG. 6 is a cross-sectional view illustrating an interconnect structure and a circuit configuration in a multichip module according to a fourth embodiment of the present invention.

FIG. 6 is a cross-sectional view illustrating an interconnect structure and a circuit configuration in a multichip module according to a fourth embodiment of the present invention. In this embodiment, an exemplary module, in which a large chip 100 and a small chip 200 include their associated internal circuit, will be described.

As shown in FIG. 6, the large chip 100 includes a number of bond pads 102 and the small chip 200 includes a number of bond pads 202. The bond pads 102 are connected to an internal circuit 101 in the large chip 100 via wires 105. The bond pads 202 are connected to an internal circuit 201 in the small chip 200 via wires 205. The bond pads 102 of the large chip 100 and the bond pads 202 of the small chip 200 are connected to each other via bumps BP.

Further, a circuit for a connection test in the large chip 100 includes a first test pad 117 and a second test pad 118. A first test voltage is applied to the first test pad 117 and a second test voltage is applied to the second test pad 118. The connection-test circuit in the large chip 100 is divided into a parallel circuit A, which is connected to the first test pad 117, and a parallel circuit B, which is connected to the second test pad 118. One of the first and second test voltages is higher than the other.

The parallel circuit A includes a first trunk wire 115a, which extends from the first test pad 117, and first branch wires 115ax, which branch off from the first trunk wire 115a and extend to be connected to the corresponding wires 105. In other words, the first branch wires 115ax are connected to the corresponding bond pads 102 via the wires 105. Each of the first branch wires 115ax includes a connection control element 112a and a resistor 113a in series.

The parallel circuit B includes a second trunk wire 115b, which extends from the second test pad 118, and second branch wires 115bx, which branch off from the second trunk wire 115b and extend to be connected to the corresponding wires 105. In other words, the second branch wires 115bx are connected to the corresponding bond pads 102 via the wires 105. Each of the second branch wires 115bx includes a connection control element 112b and a resistor 113b in series.

On the other hand, a circuit for a connection test in the small chip 200 includes an intermediate trunk wire 265, which establishes a connection between the parallel circuit A connected to the first test pad 117 and the parallel circuit B connected to the second test pad 118.

Part of the small chip connection-test circuit, which belongs to the parallel circuit A, includes first intermediate branch wires 265a, connection control elements 262a and resistors 263a. The first intermediate branch wires 265a branch off from the intermediate trunk wire 265 and each first intermediate branch wire 265a extends to its corresponding wire 205. Each first intermediate branch wire 265a includes the connection control element 262a and resistor 263a in series. That is, the first intermediate branch wires 265a are connected to the bond pads 202 via the wires 205.

Also, part of the small chip connection-test circuit, which belongs to the parallel circuit B, includes second intermediate branch wires 265b, connection control elements 262b and resistors 263b. The second intermediate branch wires 265b branch off from the intermediate trunk wire 265 and each second intermediate branch wire 265b extends to its corresponding wire 205. Each second intermediate branch wire 265b includes the connection control element 262b and resistor 263b in series. That is, the second intermediate branch wires 265b are connected to the bond pads 202 via the wires 205.

The small chip 200 is mounted onto the large chip 100 and the bumps BP are interposed between the bond pads 102 of the large chip 100 and the bond pads 202 of the small chip 200. With the bond pads 102 electrically connected to the bond pads 202 via the bumps BP, the large and small chips 100 and 200 are bonded to each other.

The module according to this embodiment has the structure in which the parallel circuits A and B are arranged in series between the first and second test pads 117 and 118. In this embodiment, the pads 116 and 216, which need to be included in the modules of the first through third embodiments, do not have to be included. That is, a connection test can be performed using the bond pads 102 and 202 and the first and second test pads 117 and 118. This means that all the pads used for the test will be used when the module is in actual operation, except for the pads 117 and 118.

As the connection control element in this embodiment, an element having a current control function, which allows current to flow into the branch wires during a connection test and no current to flow into the branch wires during an actual operation of the module, may be adopted.

MODIFIED EXAMPLE OF EMBODIMENT 4

Figure 7:
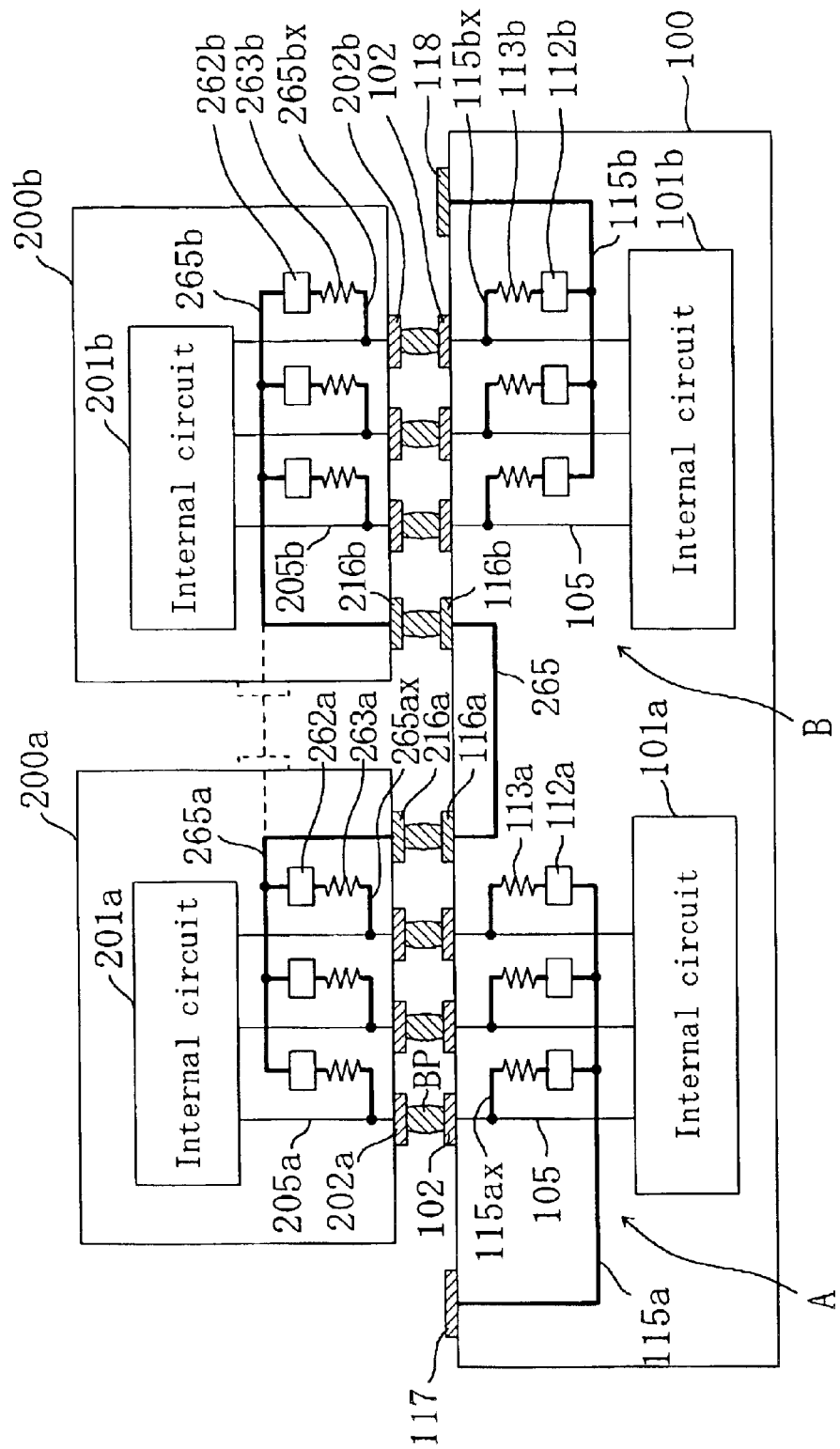
FIG. 7 is a cross-sectional view illustrating an interconnect structure and a circuit configuration in a multichip module according to a modified example of the fourth embodiment of the present invention.

FIG. 7 is a cross-sectional view illustrating an interconnect structure and a circuit configuration in a multichip module according to a modified example of the fourth embodiment of the present invention. In this embodiment, an exemplary module, in which a large chip 100, small chip 200a, and small chip 200b include their associated internal circuit, will be described.

As shown in FIG. 7, the large chip 100 includes a number of bond pads 102 and the two small chips 200a and 200b include a number of bond pads 202a and 202b, respectively.

The bond pads 102 are connected to an internal circuit 101 in the large chip 100 via wires 105. The bond pads 202a and 202b are connected to an internal circuit 201a in the small chip 200a and an internal circuit 201b in the small chip 200b, respectively, via wires 205. The bond pads 202a of the small chip 200a and the bond pads 202b of the small chip 200b are connected to the corresponding bond pads 102 of the large chip 100 via bumps BP.

Further, a circuit for a connection test in the large chip 100 includes a first test pad 117 and a second test pad 118. A first test voltage is applied to the first test pad 117 and a second test voltage is applied to the second test pad 118. The connection-test circuit in the large chip 100 is divided into a parallel circuit A, which is connected to the first test pad 117, and a parallel circuit B, which is connected to the second test pad 118. One of the first and second test voltages is higher than the other.

The parallel circuit A includes a first trunk wire 115a, which extends from the first test pad 117, and first branch wires 115ax, which branch off from the first trunk wire 115a and extend to be connected to the corresponding wires 105. In other words, the first branch wires 115ax are connected to the corresponding bond pads 102 via the wires 105. Each of the first branch wires 115ax includes a connection control element 112a and a resistor 113a in series.

The parallel circuit B includes a second trunk wire 115b, which extends from the second test pad 118, and second branch wires 115bx, which branch off from the second trunk wire 115b and extend to be connected to the corresponding wires 105. In other words, the second branch wires 115bx are connected to the corresponding bond pads 102 via the wires 105. Each of the second branch wires 115bx includes a connection control element 112b and a resistor 113b in series.

Also provided in the large chip 100 is an intermediate trunk wire 265, which functions as an connection between the parallel circuits A and B. One end of the intermediate trunk wire 265 is connected to a pad 116a which is connected to the parallel circuit A. The other end of the intermediate trunk wire 265 is connected to a pad 116b which is connected to the parallel circuit B.

On the other hand, a connection-test circuit in the small chip 200a, which is a part of the parallel circuit A, includes a first intermediate trunk wire 265a, first intermediate branch wires 265ax, connection control elements 262a and resistors 263a. The first intermediate trunk wire 265a extends from a pad 216a. The first intermediate branch wires 265ax branch off from the intermediate trunk wire 265a and each first intermediate branch wire 265ax extends to its corresponding wire 205. Each first intermediate branch wire 265ax includes the connection control element 262a and resistor 263a in series. That is, the first intermediate branch wires 265ax are connected to the bond pads 202a via the wires 205.

Also, a connection-test circuit in the small chip 200b, which is a part of the parallel circuit B, includes a second intermediate trunk wire 265b, second intermediate branch wires 265bx, connection control elements 262b and resistors 263b. The second intermediate trunk wire 265b extends from a pad 216b. The second intermediate branch wires 265bx branch off from the second intermediate trunk wire 265b and each second intermediate branch wire 265bx extends to its corresponding wire 205. Each second intermediate branch wire 265bx includes the connection control element 262b and resistor 263b in series. That is, the second intermediate branch wires 265bx are connected to the bond pads 202b via the wires 205.

The small chips 200a and 200b are mounted onto the large chip 100 and the bumps BP are interposed between the bond pads 102 of the large chip 100 and the bond pads 202a of the small chip 200a, and between the bond pads 102 and the bond pads 202b of the small chip 200b. With the bond pads 102 electrically connected to the bond pads 202a and 202b via the bumps BP, the small chips 200a and 200b are bonded onto the large chip 100.

As described above, where the respective parts of the parallel circuits A and B are included in the small chips 200a and 200b, respectively, a connection test can be carried out using the parallel circuits A and B, as in the fourth embodiment. It should be noted that the pad 216a of the small chip 200a and the pad 216b of the small chip 200b may be connected via a wire, for example. In that case, the large chip 100 does not have to include the pads 116a and 116b. Also, the pads 216a and 216b may be formed on the respective sides (or the respective upper surfaces) of the small chips 200a and 200b and then may be connected with a wire or a bump, for example, as indicated by the dashed lines in FIG. 7.

Furthermore, the module may include three or more small chips. In that case, the connection test circuit may include the same number of the parallel circuits as that of the small chips included.

In the modules of the foregoing embodiments, a connection test to determine whether the connections are properly made or not between the bond pads when the small chip 200 is bonded onto the large chip 100, can be performed as follows.

Embodiment 5

Figure 8:
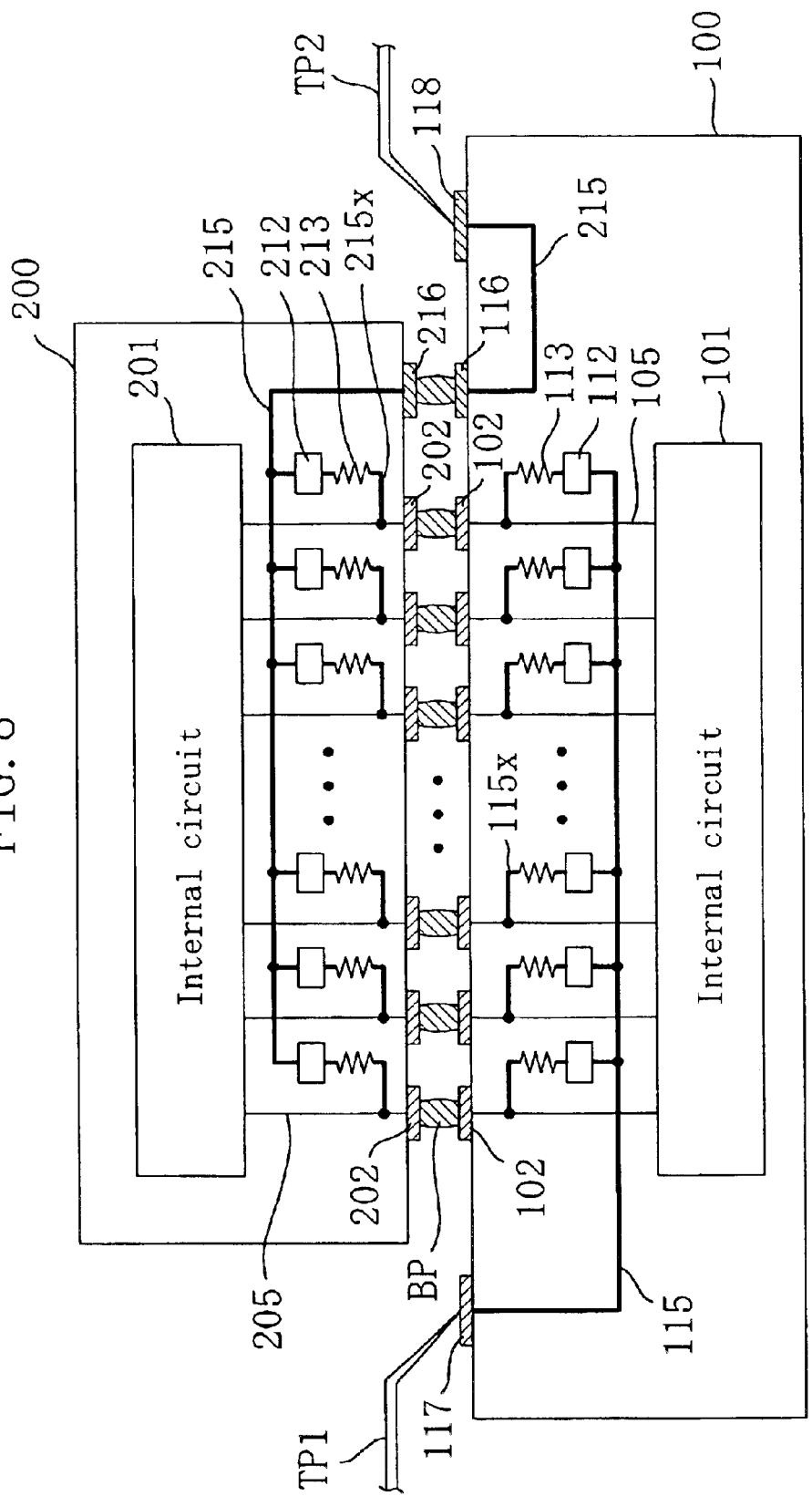
FIG. 8 illustrates how to perform a connection test according to a fifth embodiment of the present invention.

FIG. 8 illustrates how to perform a connection test according to a fifth embodiment of the present invention. In this embodiment, an exemplary case, in which the connection test circuit (see the description of FIG. 2) of the second embodiment is used, will be described.

Firstly, first and second test pins TP1 and TP2 of a tester are put into contact with the first and second test pads 117 and 118, respectively. Then, a first voltage (of e.g., about 2 V) is applied to the first test pad 117 from the first test pin TP1. And, a second voltage (of e.g., 0 V) is applied to the second test pad 118 from the second test pin TP2. An electric current flowing between the first and second test pads 117 and 118 is then measured. If the measured current value is smaller, by a predetermined value, than a current value that is supposed to be obtained when all the pads are properly connected, it is determined that part of the connections is not properly made between the bond pads. Thus, it is possible to test the connection of the multichip module in which the multiple chips are bonded to each other, in a simple and quick manner.

For example, where each of the connection test circuits in the chips 100 and 200 includes one hundred pads and each resistor has a resistance of 1 k Ω, the total resistance of the resistors that are arranged in parallel will be 10 Ω if all the bond pads are properly connected. Thus, when the resistance of the wires is regarded as negligible, a current of 200 mA should flow between the test pins TP1 and TP2 when a test voltage applied is 2V. However, when only one of the hundred connections is not properly made between the bond pads, the total resistance of the resistors that are arranged in parallel will be about 10.0 Ω, and a current flowing between the test pins TP1 and TP2 will be 198 mA. The difference between the current values can be easily detected in terms of detection sensitivity and detection accuracy. For example, by setting the threshold value to 199 mA, it is possible to determine whether the connections between the bond pads are properly made or not. Specifically, when the current is equal to or greater than 199 mA, all the connections are properly made, and when the current is smaller than 199 mA, part of the connections is not properly made.

According to this embodiment, where the chip-on-chip (which is so-called "COC") multichip module includes the small and large chips each having the many signal-sending/receiving pads and the small chip pads are connected to the corresponding large chip pads, a connection test is not performed with respect to each of the connections between the pads, but to the many connections at the same time. Specifically, the test for determining whether the connections are properly made or not is carried out by electrically connecting the resistors to the many pads and utilizing changes in the resistance of the resistors that are arranged in parallel. As a result, the connection test can be quickly performed using the connection test circuit with such a simple structure.

Embodiment 6

Figure 9:
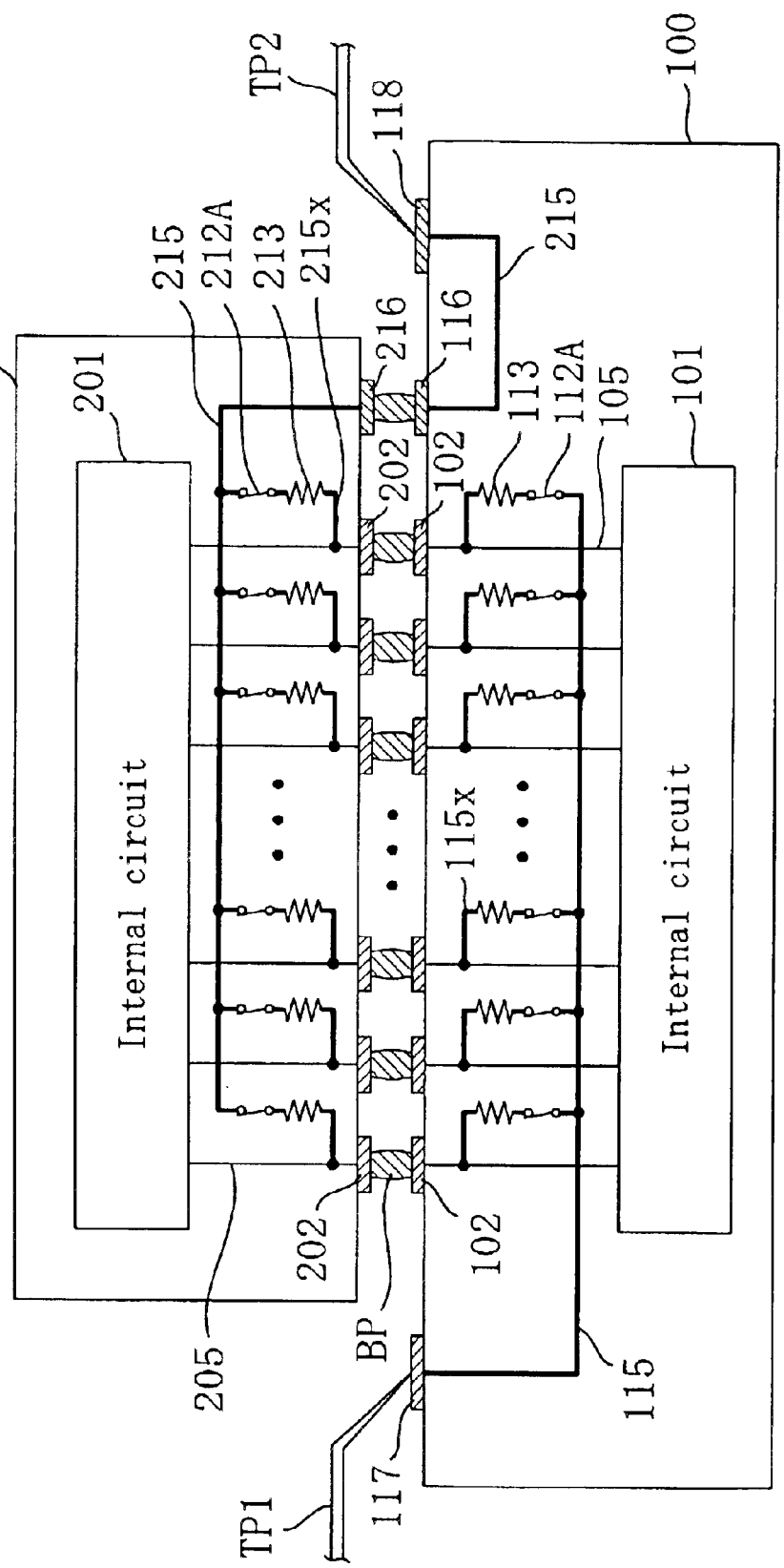
FIG. 9 illustrates how to perform a connection test according to a sixth embodiment of the present invention.

FIG. 9 illustrates how to perform a connection test according to a sixth embodiment of the present invention. In this embodiment, an exemplary case, in which the connection test circuit (see the description of FIG. 3) of the first example of the second embodiment is used, will be described.

Firstly, first and second test pins TP1 and TP2 of a tester are put into contact with the first and second test pads 117 and 118, respectively. Then, a first voltage (of e.g., about 2 V) is applied to the first test pad 117 from the first test pin TP1. And, a second voltage (of e.g., 0 V) is applied to the second test pad 118 from the second test pin TP2. When the voltages are applied, the switching transistors 112A and 212A are controlled so as to be closed (or turned ON) by the control circuit (not shown). An electric current flowing between the first and second test pads 117 and 118 is then measured. If the measured current value is smaller, by a predetermined value, than a current value that is supposed to be obtained when all the pads are properly connected, it is determined that part of the connections is not properly made between the bond pads, as specifically described in the fifth embodiment.

Accordingly, it is possible to test the connection of the multichip module in which the multiple chips are bonded to each other, in a simple and quick manner.

In this embodiment, after the connection test has been completed, the switching transistors 112A and 212A are controlled so as to be opened (or turned OFF). Thus, no signal is sent to the branch wires 115x and 215x when the module is actually in use, which allows the internal circuits 101 and 201 to operate independently of the connection test circuits.

Embodiment 7

Figure 10:
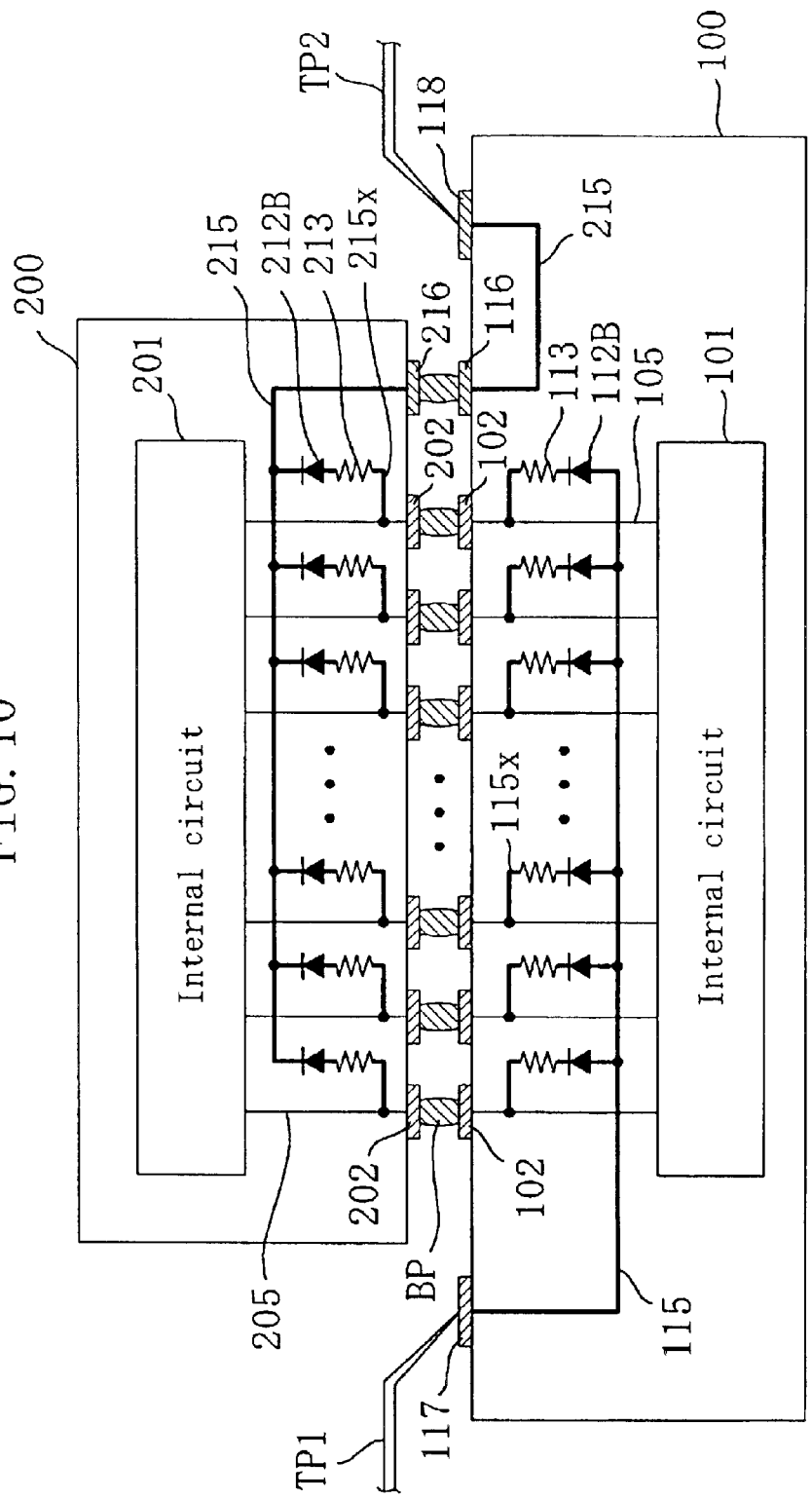
FIG. 10 illustrates how to perform a connection test according to a seventh embodiment of the present invention.

FIG. 10 illustrates how to perform a connection test according to a seventh embodiment of the present invention. In this embodiment, an exemplary case, in which the connection test circuit (see the description of FIG. 4) of the second example of the second embodiment is used, will be described.

Firstly, first and second test pins TP1 and TP2 of a tester are put into contact with the first and second test pads 117 and 118, respectively. Then, a first voltage (of e.g., about 2 V) is applied to the first test pad 117 from the first test pin TP1. And, a second voltage (of e.g., 0 V) is applied to the second test pad 118 from the second test pin TP2. In this embodiment, the diodes 112B and 212B (as the connection control elements) are arranged so as to have a polarity by which the diodes are forward biased when the first and second test voltages are applied. Thus, unlike in the sixth embodiment, the connection control elements do not have to be controlled so as to be turned ON and OFF in the module of this embodiment. An electric current flowing between the first and second test pads 117 and 118 is then measured. If the measured current value is smaller, by a predetermined value, than a current value that is supposed to be obtained when all the pads are properly connected, it is determined that part of the connections is not properly made between the bond pads, as specifically described in the fifth embodiment.

Accordingly, it is possible to test the connection of the multichip module in which the multiple chips are bonded to each other, in a simple and quick manner.

In this embodiment, when the module is actually used after the connection test has been completed, the internal circuits 101 and 201 can be operated independently of the connection test circuit which remains as it is. The reasons are as follows. Any two of the wires 105 of the large chip 100 are connected to each other via associated two of the branch wires 115x. And any two of the wires 205 of the small chip 200 are also connected to each other via associated two of the branch wires 215x. However, a pair of the diodes existing in a path between such two branch wires is arranged so as to have mutually-opposite polarities for a current flowing in the path. Thus, no signal flows between the wires 105 of the large chip 100, and also between the wires 205 of the small chip 200, through the connection test circuit.

An advantage of the module of this embodiment is that, without including any control circuit for the connection control elements, the connection test can be carried out and the module can be actually operated.

After the connection test of the multichip module has been completed, in order to used the module as a commercial product, the first and second test pads 117 and 118 are connected to a ground wire and a power voltage supply wire of an I/O circuit, respectively, so that no current flows into the connection test circuit.

Embodiment 8

Figure 11:
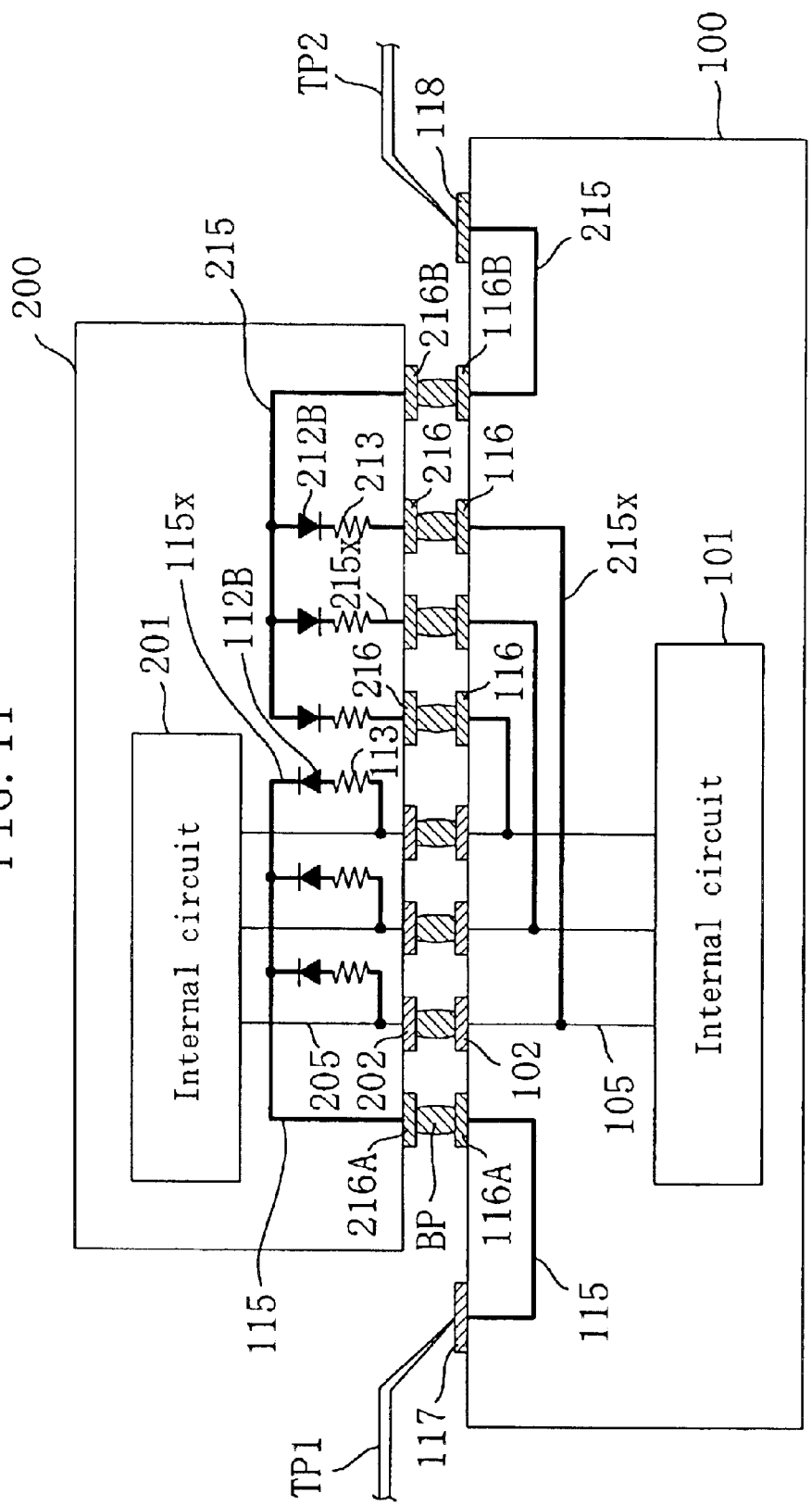
FIG. 11 illustrates how to perform a connection test according to an eighth embodiment of the present invention.

FIG. 11 illustrates how to perform a connection test according to an eighth embodiment of the present invention. FIG. 11 also illustrates an interconnect structure and a circuit configuration in a multichip module. In this embodiment, an exemplary module, in which a large chip 100 and a small chip 200 include their associated internal circuit, will be described.

As shown in FIG. 11, the structure of the connection test circuit of this embodiment is a modified example of the structure shown in FIG. 4 described in the third embodiment.

The large chip 100 includes a number of bond pads 102 and the small chip 200 includes a number of bond pads 202. The bond pads 102 are connected to an internal circuit 101 in the large chip 100 via wires 105. The bond pads 202 are connected to an internal circuit 201 in the small chip 200 via wires 205. The bond pads 102 of the large chip 100 and the bond pads 202 of the small chip 200 are connected to each other via bumps BP.

Further, a circuit for a connection test in the large chip 100 includes a first test pad 117 and a second test pad 118. A first test voltage is applied to the first test pad 117 and a second test voltage is applied to the second test pad 118. A connection test is carried out by applying a high voltage to the first test pad 117 and a low voltage to the second test pad 118.

Also provided in the large chip 100 are a first trunk wire 115, pad 116A, second trunk wire 215, pad 116B, parts of second branch wires 215x, and pads 116. The first trunk wire 115 extends from the first test pad 117. The pad 116A is inserted in the first trunk wire 115. The second trunk wire 215 extends from the second test pad 118. The pad 116B is inserted in the second trunk wire 215. The respective parts of the second branch wires 215x, which branch off from the second trunk wire 215 in the small chip 200, extend to be connected to the corresponding wires 105. The pads 116 are inserted in the respective second branch wires 215x.

Provided in the small chip 200 are a pad 216A, first trunk wire 115, first branch wires 115x, pad 216B, second trunk wire 215, and second branch wires 215x. The pad 216A is connected to the pad 116A of the large chip 100 via the bump BP. The first trunk wire 115 extends from the pad 216A. The first branch wires 115x branch off from the first trunk wire 115 and extend to be connected to the corresponding wires 205. The pad 216B is connected to the pad 116B of the large chip 100 via the bump BP. The second trunk wire 215 extends from the pad 216B. The second branch wires 215x branch off and extend from the second trunk wire 215. Each of the first branch wires 115x includes a diode 112B and a resistor 113 in series. Each of the second branch wires 215x includes a diode 212B and a resistor 213 in series. The first branch wires 115x are connected to the bond pads 202 via the wires 205. The second branch wires 215x are connected to the bond pads 102 via the wires 105.

Specifically, the large and small chips 100 and 200 are connected by the first trunk wires 115 with the pads 116A and 216A and bump BP interposed therebetween. The large and small chips 100 and 200 are also connected by the second trunk wires 215 with the pads 116B and 216B and bump BP interposed therebetween. The large and small chips 100 and 200 are also connected by the second branch wires 215x with the many pads 116 and 216 and bumps BP interposed therebetween. And the first branch wires 115x are formed in the small chip 200. Accordingly, all the elements of the connection test circuit exist in the small chip 200. The large chip 100 does not include any element of the connection test circuit but includes only the wires for the connection test circuit.

In this embodiment, first and second test pins TP1 and TP2 of a tester are also put into contact with the first and second test pads 117 and 118, respectively, at the time of a connection test. Then, a first voltage (of e.g., about 2 V) is applied to the first test pad 117 from the first test pin TP1. And, a second voltage (of e.g., 0 V) is applied to the second test pad 118 from the second test pin TP2. The diodes 112B and 212B (as the connection control elements) are arranged so as to have a polarity by which the diodes are forward biased when the first and second test voltages are applied. As a result, unlike in the sixth embodiment, the connection control elements do not have to be controlled so as to be brought into and out of conduction. An electric current flowing between the first and second test pads 117 and 118 is then measured. If the measured current value is smaller, by a predetermined value, than a current value that is supposed to be obtained when all the pads are properly connected, it is determined that part of the connections is not properly made between the bond pads, as specifically described in the fifth embodiment.

Accordingly, it is possible to test the connection of the multichip module in which the multiple chips are bonded to each other, in a simple and quick manner.

In this embodiment, when the module is actually used after the connection test has been completed, the internal circuits 101 and 201 can be operated independently of the connection test circuit which remains as it is. The reasons are as follows. Any two of the wires 105 of the large chip 100 are connected to each other via associated two of the branch wires 115x. And any two of the wires 205 of the small chip 200 are also connected to each other via associated two of the branch wires 215x. However, a pair of the diodes existing in a path between such two branch wires is arranged so as to have mutually-opposite polarities for a current flowing in the path. Thus, no signal flows between the wires 105 of the large chip 100, and also between the wires 205 of the small chip 200, through the connection test circuit.

As in the seventh embodiment, an advantage of the module of this embodiment is also that, without including any control circuit for the connection control elements, the connection test can be carried out and the module can be actually operated.

After the connection test of the multichip module has been completed, in order to used the module as a commercial product, the first and second test pads 117 and 118 are connected to a ground wire and a power voltage supply wire of an I/O circuit, respectively, so that no current flows into the connection test circuit.

Embodiment 9

Figure 12:
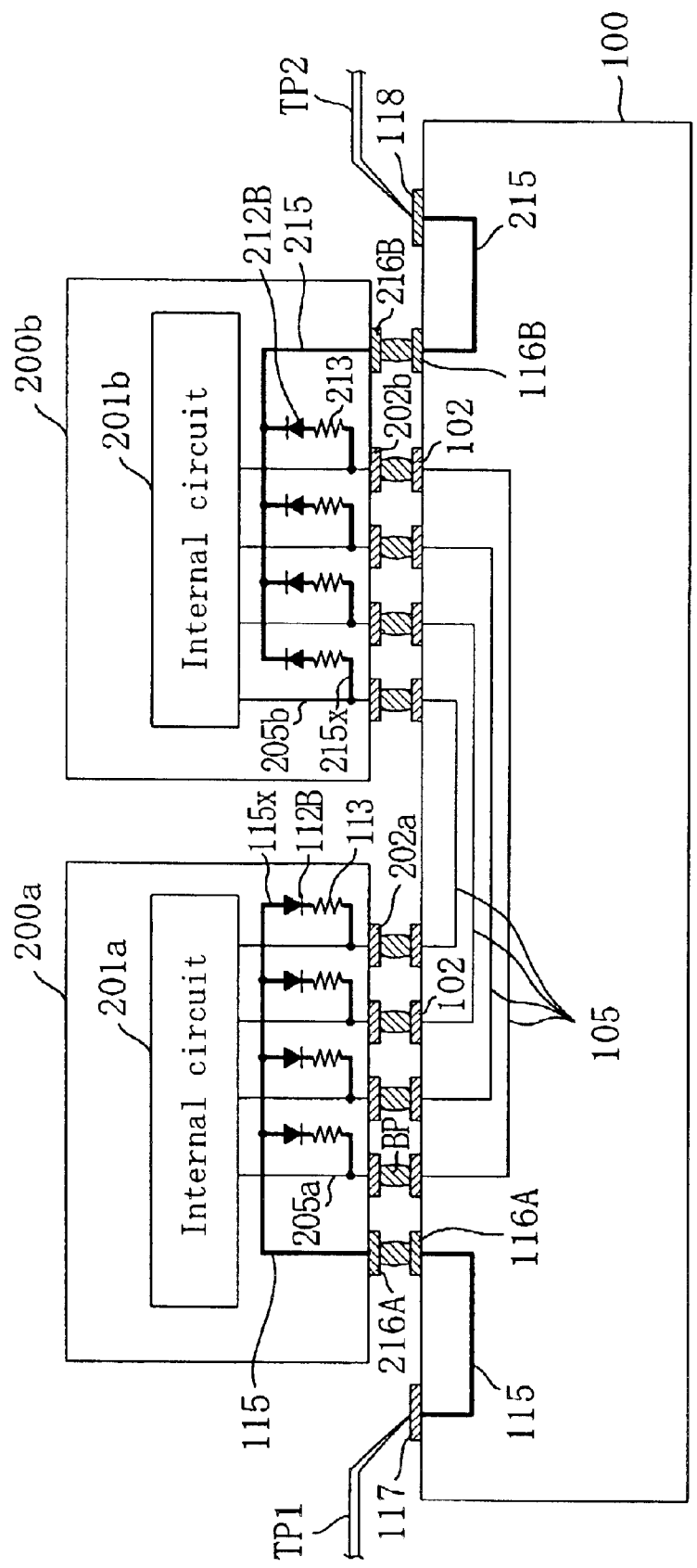
FIG. 12 illustrates how to perform a connection test according to a ninth embodiment of the present invention.

FIG. 12 illustrates how to perform a connection test according to a ninth embodiment of the present invention. FIG. 12 also illustrates an interconnect structure and a circuit configuration in a multichip module. In this embodiment, an exemplary module, in which two small chips 200a and 200b include their associated internal circuit but a large chip 100 includes no internal circuit, will be described.

The large chip 100 includes a number of bond pads 102 and the small chips 200a and 200b also include a number of bond pads 202a and 202b, respectively. The bond pads 102 of the large chip 100 are connected to each other with wires 105. The bond pads 202a of the small chip 200a are connected to an internal circuit 201a in the small chip 200a via wires 205a. The bond pads 202b of the small chip 200b are connected to an internal circuit 201b in the small chip 200b via wires 205b. The bond pads 202a and 202b of the respective small chips 200a and 200b are connected to the corresponding bond pads 102 of the large chip 100 via bumps BP. That is, the internal circuits 201a and 201b in the respective small chips 200a and 200b are connected to each other via the wires 105 of the large chip 100.

Further, a circuit for a connection test in the large chip 100 includes a first test pad 117 and a second test pad 118. A first test voltage is applied to the first test pad 117 and a second test voltage is applied to the second test pad 118. One of the first and second voltages is higher than the other.

Also provided in the large chip 100 are a first trunk wire 115, pad 116A, second trunk wire 215, and pad 116B. The first trunk wire 115 extends from the first test pad 117. The pad 116A is inserted in the first trunk wire 115. The second trunk wire 215 extends from the second test pad 118. And the pad 116B is inserted in the second trunk wire 215.

On the other hand, the small chip 200a includes pad 216A, first trunk wire 115, and first branch wires 115x. The pad 216A is connected to the pad 116A of the large chip 100 via the bump BP. The first trunk wire 115 extends from the pad 216A. The first branch wires 115x branch off from the first trunk wire 115 and extend to be connected to the corresponding wires 205a. Each of the first branch wires 115x includes a diode 112B and a resistor 113 in series. And the first branch wires 115x are connected to the bond pads 202a via the wires 205a.

Also, the small chip 200b includes pad 216B, second trunk wire 215, and second branch wires 215x. The pad 216B is connected to the pad 116B of the large chip 100 via the bump BP. The second trunk wire 215 extends from the pad 216B. The second branch wires 215x branch off from the second trunk wire 215 and extend to be connected to the corresponding wires 205b. Each of the second branch wires 215x includes a diode 212B and a resistor 213 in series. And the second branch wires 215x are connected to the bond pads 202b via the wires 205b.

Specifically, the large and small chips 100 and 200a are connected by the first trunk wires 115 with the pads 116A and 216A and bump BP interposed therebetween. The large and small chips 100 and 200b are also connected by the second trunk wires 215 with the pads 116B and 216B and bump BP interposed therebetween. The first branch wires 115x are formed in the small chip 200a, and the second branch wires 215x are formed in the small chip 200b. Accordingly, all the elements of the connection test circuit exist in the small chips 200a and 200b. The large chip 100 does not include any element of the connection test circuit but includes only the wires for the connection test circuit.

In this embodiment, first and second test pins TP1 and TP2 of a tester are also put into contact with the first and second test pads 117 and 118, respectively, at the time of a connection test. Then, a first voltage (of e.g., about 2 V) is applied to the first test pad 117 from the first test pin TP1. And, a second voltage (of e.g., 0 V) is applied to the second test pad 118 from the second test pin TP2. The diodes 112B and 212B (as the connection control elements) are arranged so as to have a polarity by which the diodes are forward biased when the first and second test voltages are applied. As a result, unlike in the sixth embodiment, the connection control elements do not have to be controlled and brought into and out of conduction. An electric current flowing between the first and second test pads 117 and 118 is then measured. If the measured current value is smaller, by a predetermined value, than a current value that is supposed to be obtained when all the pads are properly connected, it is determined that part of the connections is not properly between the bond pads, as specifically described in the fifth embodiment.

Accordingly, it is possible to test the connection of the multichip module in which the multiple chips are bonded to each other, in a simple and quick manner.

In this embodiment, when the multichip module is actually operated after the connection test has been completed, the internal circuits 101 and 201 can be operated independently of the connection test circuit which remains as it is. The reasons are as follows. Any two of the wires 205a of the small chip 200a are connected to each other via associated two of the branch wires 115x. And any two of the wires 205b of the small chip 200b are also connected to each other via associated two of the branch wires 215x. However, a pair of the diodes existing in a path between such two branch wires is arranged so as to have mutually-opposite polarities for a current flowing in the path. Thus, no signal flows between the wires 205a of the small chip 200a, and also between the wires 205b of the small chip 200b, through the connection test circuit.

As in the seventh embodiment, an advantage of the module of this embodiment is also that, without including any control circuit for the connection control elements, the connection test can be carried out and the module can be actually used.

Further, in this embodiment, the connection test circuit in the large chip 100 does not need to include any element. Thus, the structure of the module of this embodiment is particularly suitable for a case where the large chip 100 is used as a chip that includes only wires.

Other Embodiment

In the foregoing embodiments, the diodes should be forward biased when the test voltages are applied. Thus, where a low voltage is applied to the first test pad 117 and a high voltage is applied to the second test pad 118, the diodes may be placed so as to have a forward bias in a direction opposite to the direction in which the diodes of the foregoing embodiments are forward biased.

Instead of using the diodes of the foregoing embodiments, an NMISFET in which a short circuit is established between its drain region and substrate region (i.e., the direction from the drain region to source region is the forward direction) or a PMISFET in which a short circuit is established between its source region and substrate region (i.e., the direction from the source region to drain region is the forward direction) may be adopted as the connection control element of the present invention.

After the connection test of the multichip module has been completed, in order to use the module as a commercial product, the first and second test pads 117 and 118 are connected to a ground wire and a power voltage supply wire of an I/O circuit, respectively, so that no current flows into the connection test circuit.

In the foregoing embodiments, each resistor placed in its corresponding branch wire is located between the corresponding connection control element and the wire that is connected to the branch wire. However, in the present invention, the resistors do not have to be placed in the location described in the foregoing embodiments. That is, the resistors may be placed in any part of the respective branch wires. Further, in the second through eighth embodiments, each of two branch wires connected to a pair of the bond pads that are mutually connected includes its corresponding resistor. However, in the present invention, if one of the two branch wires connected to the pair of the mutually-connected bond pads includes the resistor, it is possible to determine whether the connection between the bond pads is properly made or not.

Furthermore, in the foregoing embodiments, the first and second test pads 117 and 118 are included. However, in the present invention, the test pads do not have to be included. This is because where the trunk wires are wide enough, the test voltages can be applied by putting the test pins into direct contact with the trunk wires.

Moreover, in the foregoing embodiments, the multichip modules may include chips other than those illustrated. In that case, the test pads do not necessarily have to be formed on any of the two or three chips on which the connection test is carried out. Even where the test pads are formed on a chip on which the connection test is not performed, the test voltages can be applied without causing any problem so long as the test pads are connected to their associated trunk wires via the wires.

In addition, in the foregoing embodiments, the modules have the structure in which the branch wires are connected to the wires and then connected to the bond pads via the wires. However, in the present invention, the branch wires do not need to be directly connected to the wires but may be directly connected to the bond pads.

What is claimed is:

1. A multichip module, which includes a plurality of chips each having a plurality of bond pads, and which is formed by electrically connecting the bond pads of the chips to the corresponding bond pads of another one of the chips, the module comprising:
    a plurality of trunk wires; and
    a plurality of branch wires, which are electrically connected to two of the trunk wires so as to be in electrical parallel with each other,
    wherein each of the bond pads is connected to an associated one of the trunk wires via an associated one of the branch wires.

2. The multichip module of claim 1, further comprising a plurality of connection control elements inserted in the respective branch wires.

3. The multichip module of claim 2, wherein each of the connection control elements is a switching element.

4. The multichip module of claim 2, wherein each of the connection control elements is a rectifying element having a polarity by which the rectifying element is forward biased when a voltage is applied to the branch wires at a time of a connection test.

5. The multichip module of claim 1, wherein the chips include a first chip having a first set of bond pads, and a second chip having a second set of bond pads, wherein the first and second sets of bond pads are electrically connected to each other, wherein the trunk wires include a first trunk wire and a second trunk wire, wherein the branch wires include a first set of branch wires branching off from the first trunk wire, and a second set of branch wires branching off from the second trunk wire, wherein the bond pads of the first set are connected to the branch wires of the first set, respectively, and wherein the bond pads of the second set are connected to the branch wires of the second set, respectively.

6. The multichip module of claim 5, wherein one set of the first and second sets of branch wires extends into the first and second chips.

7. The multichip module of claim 1, wherein the chips include:

a first chip having a first set of bond pads;

a second chip having a second set of bond pads;

a third chip having a third set of bond pads, a fourth set of bond pads, and wires connecting the third and fourth sets of bond pads to each other, wherein the bond pads of the first set are electrically connected to the respective bond pads of the third set, and the bond pads of the second set are electrically connected to the respective bond pads of the fourth set, wherein the trunk wires include a first trunk wire and a second trunk wire, and wherein the branch wires include:

a first set of branch wires branching off from the first trunk wire and located between the first trunk wire and the bond pads of the first set, and a second set of branch wires branching off from the second trunk wire and located between the second trunk wire and the bond pads of the second set.

8. The multichip module of claim 1, wherein the chips include a first chip having a first set of bond pads, and a second chip having a second set of bond pads, wherein the first and second sets of bond pads are electrically connected to each other, wherein the trunk wires include a first trunk wire, a second trunk wire, and an intermediate trunk wire that is connected to the first and second trunk wires, wherein the branch wires include:

a first set of branch wires that extend from the first trunk wire so as to be in parallel with each other;

a second set of branch wires that extend from the second trunk wire so as to be in parallel with each other;

a first set of intermediate branch wires that extend from the intermediate trunk wire so as to be in parallel with each other and in series with the respective branch wires of the first set; and a second set of intermediate branch wires that extend from the intermediate trunk wire so as to be in parallel with each other and in series with the respective branch wires of the second set, wherein the bond pads of the first set are connected to the branch wires of the first or second set, respectively, and wherein the bond pads of the second set are connected to the intermediate branch wires of the first or second set, respectively.

9. The multichip module of claim 1, wherein the chips include a first chip having a first set of bond pads, a second chip having a second set of bond pads, and a third chip having a third set of bond pads, wherein the first chip and the second chip are electrically connected to each other, and the first chip and the third chip are electrically connected to each other, wherein the trunk wires include a first trunk wire, a second trunk wire, and an intermediate trunk wire that is connected to the first and second trunk wires and that extends into the second and third chips, wherein the branch wires include:

a first set of branch wires that extend from the first trunk wire so as to be in parallel with each other;

a second set of branch wires that extend from the second trunk wire so as to be in parallel with each other;

a first set of intermediate branch wires that extend from the intermediate trunk wire so as to be in parallel with each other and in series with the respective branch wires of the first set; and a second set of intermediate branch wires that extend from the intermediate trunk wire so as to be in parallel with each other and in series with the respective branch wires of the second set, wherein the bond pads of the first set are connected to the branch wires of the first or second set, respectively, wherein the bond pads of the second set are connected to the intermediate branch wires of the first set, respectively, and wherein the bond pads of the third set are connected to the intermediate branch wires of the second set, respectively.

10. The multichip module of claim 1, wherein a resistor is inserted in at least one of two parts of each said branch wire, each of the two parts being interposed between one of the two trunk wires and a pair of mutually connected bond pads.

* * * * *